(12) United States Patent
Park et al.

(10) Patent No.: US 7,267,932 B2
(45) Date of Patent: *Sep. 11, 2007

(54) METHOD FOR HIGH RESOLUTION PATTERNING USING SOFT X-RAY, PROCESS FOR PREPARING NANO DEVICE USING THE SAME METHOD

(75) Inventors: Joon Won Park, Pohang (KR); Young Hye La, Pohang (KR); Joong Ho Moon, Pohang (KR); Bongsoo Kim, Pohang (KR); Tai Hee Kang, Pohang (KR); Ki Jeong Kim, Pohang (KR)

(73) Assignee: Postech Foundation, Pohang, Kyungsangbuk-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/489,411

(22) PCT Filed: Sep. 12, 2002

(86) PCT No.: PCT/KR02/01714

§ 371 (c)(1),
(2), (4) Date: Mar. 12, 2004

(87) PCT Pub. No.: WO03/023517

PCT Pub. Date: Mar. 20, 2003

(65) Prior Publication Data

US 2004/0241590 A1 Dec. 2, 2004

(30) Foreign Application Priority Data

Sep. 12, 2001 (KR) ................................ 2001-56221

(51) Int. Cl.
*G03C 5/00* (2006.01)
(52) U.S. Cl. ........................ 430/322; 430/311; 430/967
(58) Field of Classification Search ...................... None
See application file for complete search history.

(56) References Cited

U.S. PATENT DOCUMENTS

| | | | |
|---|---|---|---|
| 5,079,600 A | | 1/1992 | Schnur et al. |
| 5,389,496 A | | 2/1995 | Calvert et al. |
| 5,648,201 A | | 7/1997 | Dulcey et al. |
| 6,436,615 B1 * | | 8/2002 | Brandow et al. ............ 430/324 |
| 2004/0241582 A1 * | | 12/2004 | Park et al. .................. 430/296 |

FOREIGN PATENT DOCUMENTS

| JP | 2005502917 A | 1/2005 |
|---|---|---|
| WO | WO 01/01199 A1 | 1/2001 |
| WO | WO 03/023518 A1 | 3/2003 |

OTHER PUBLICATIONS

Younan Xia et al., *Soft Lithography*, 1988, 37, 550-575 Angew. Chem. Int. Ed.

* cited by examiner

*Primary Examiner*—John A. McPherson
*Assistant Examiner*—Daborah Chacko-Davis
(74) *Attorney, Agent, or Firm*—Rothwell, Figg, Ernst & Manbeck PC

(57) ABSTRACT

A method for nano-scale high resolution patterning of self-assembled monolayer using soft X-rays is provided. The method involves forming an aromatic imine molecular layer having substituents at its terminal rings on a substrate, selectively cleaving bonds to the subsituents of the aromatic imine molecular layer, and hydrolyzing the aromatic imine molecular layer 9 Claims, 8 Drawing Sheets

METHOD FOR HIGH RESOLUTION PATTERNING USING SOFT X-RAY, PROCESS FOR PREPARING NANO DEVICE USING THE SAME METHOD

BACKGROUND OF THE INVENTION

1. Field of the Invention

The present invention relates to a method for high resolution patterning and a process for manufacturing a nano device using the high resolution pattern, and more particularly, to a method for micro- or nano-scale high resolution patterning within a short period of time, and a nano device formed using the method.

2. Description of the Related Art

With recent advances in the semiconductor industry and the need for highly-integrated semiconductor devices, nano- or micro-fabrication technologies for minute patterning attract more and more attention.

As is expected by many experts that nanotechnology will be one of the leading technologies in the 21st century, nano-pattern fabrication is an essential technology of the highest priority in minute-circuit processing for large-capacity semiconductor devices. In addition, nano-patterning technology has wide applications, for example, in the bioengineering related field and for biosensors, so its consequence becomes great.

So far, surface patterning has been achieved by photolithography employing deep UV radiation and polymer-photoresists, leading to stunning advances in the semiconductor industry for the last decade.

Pattern resolution in photolithography is determined according to Rayleigh's equation, $R=k_1 \lambda/NA$, where R denotes resolution, $\lambda$ denotes wavelength, $k_1$ is a constant, and NA denotes the numerical aperture of a lens system. A shorter wavelength of light used results in higher resolution and smaller patterns. A pattern resolution on the order of 500 nm, achieved in the early 1980s by G-line (436 nm) exposure systems using high-pressure mercury lamps, has markedly been reduced to 180 nm recently by the use of 248-nm KrF eximer laser exposure technology, thereby realizing the production of 1-Gb memory semiconductors (Solid State Technol., January 2000). However, due to the limitations in the wavelength of usable light, equipment and technology requirements, and the resolution of polymeric photoresist used, it is difficult to form nano-scale high-resolution patterns with this method.

For higher pattern resolutions, many attempts have been made since 1990, for example, using self-assembled monolayers as a new photoresist, instead of polymers used in conventional photolithography, and using light of a short wavelength. In addition, new patterning technologies for self-assembled monolayers, for example, soft lithography or scanning probe lithography using tips of AFM and STM have been introduced.

In the early 1990s, Whitesides, a professor at Harvard University, termed surface patterning using an elastomeric stamp or mold to ink a solid substrate with the help of molecular self-assembly, not using light or high energy particles, as "soft lithography" and reported many research results (Appl. Phys. Lett., 1993, 63, 2002). A representative example is concerned with microcontact printing (μCP) involving stamping surfactant molecules, for example, alkanethiol, in a surface area with a polydimethylsiloxane (PDMS) elastomer stamp to form patterns of self-assembled monolayers only on the stamping area. This microcontact printing enables speedy and economical consecutive patternings. However, this technique has some problems to be solved, such as inaccurate registration (<1 μm) due to the deformation of an elastomeric stamp, incompatibility with current integrated circuit (IC) processes, etc.

Recently, Mirkin et al. have developed "dip-pen" nanolithography (DPN) which uses an AFM tip as a "nib", a solid substrate (for example, Au) as "paper", and molecules with a chemical affinity for the solid substrate as "ink". Molecules are delivered from the AFM tip to a solid substrate of interest via capillary transport (Science, 1999, 283, 661). Due to the use of elaborately formed sharp tips, dip-pen nanolithography offers a high-resolution, nano-scale pattern of about 5 nm. However, its time-consuming serial pattern drawing processes limit commercialization through mass production.

SUMMARY OF THE INVENTION

Therefore, the present invention provides a method for fabricating a high resolution pattern of a desired shape within a short period of time.

The present invention provides a substrate with a high resolution pattern.

The present invention also provides a method for manufacturing a high-performance and miniaturized semiconductor device using the high resolution pattern.

The present invention also provides a method for manufacturing a high-density biochip using the high resolution pattern.

The present invention provides a method for high resolution patterning, comprising: (a) forming an aromatic imine monolayer having substituted terminal rings on a substrate; (b) selectively removing the substituents from the aromatic imine monolayer; and (c) hydrolyzing the aromatic imine monolayer.

In an embodiment of the method according to the present invention, (a) forming the substituted aromatic imine monolayer on the substrate may comprise forming a aminosilylated or aminothiolated self-assmebled monolayers on the substrate and processing the surface of the aminosilylated or amnothiolated monolayer with an aromatic aldehyde having a substituted terminal ring.

The substituent of the aromatic aldehyde with the substituted terminal ring may be a nitro group or halogen group.

The aromatic aldehyde having the substituted terminal ring may be a conjugated or non-conjugated aromatic aldehyde. The non-conjugated aromatic aldehyde with the substituted terminal ring may be a compound of formula (1) below:

(1)

where X is $NO_2$, F, Cl, Br, or I. The conjugated aromatic aldehyde with the substituted terminal ring may be a compound of formula (2), (3), or (4) below:

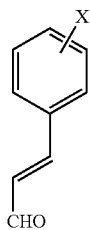

(2)

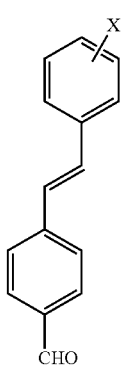

(3)

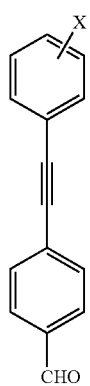

(4)

In formulae (2), (3), and (4) above, X is $NO_2$, F, Cl, Br, or I.

The substrate used in the present invention may be a silica or gold substrate.

In another embodiment of the high resolution patterning method according to the present invention, (b) selectively removing the substitutents from the aromatic imine molecular layer may comprise exposing the substrate through a photomask to soft X-rays. In this case, the soft X-rays may have a wavelength of 0.3-10 nm at an energy of 40-1,500 eV. The photomask may be a zone plate.

The present invention also provides a substrate with a nano-scale pattern featuring alternating height, chemical reactivity, and wettability on sub-100 nm dimensions, the substrate comprising a base plate and a surface layer on the base plate, wherein the surface layer includes a hydrophilic amine molecular layer in a region and a hydrophobic aromatic imine molecular layer in the other region which form the nano-scale pattern together.

The present invention also provides a method for manufacturing a semiconductor device with a nano-scale pattern, the method comprising coating a diblock copolymer onto the above substrate having the nano-scale pattern and annealing and etching the substrate coated with the diblock copolymer. The diblock copolymer may be poly(stylene-block-methylmethacrylate). The present invention also provides a biochip fabricated by immobilizing proteins, DNA, or RNA on amine groups previously attached to the above nanopatterned substrate according to the present invention.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
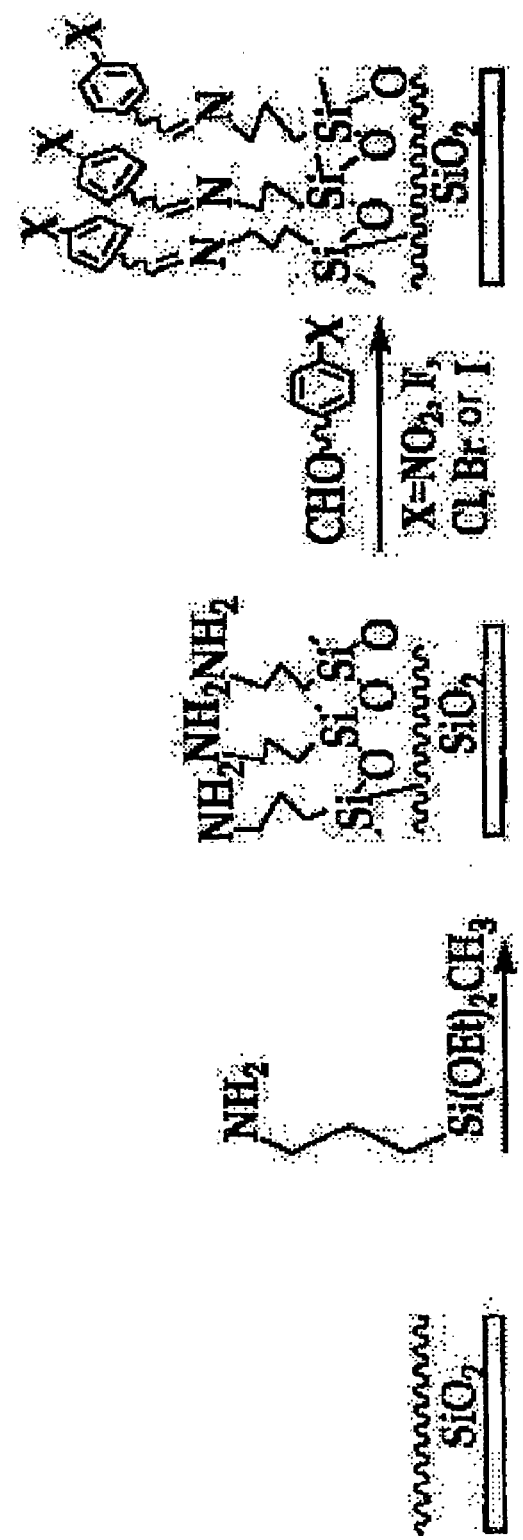
FIG. 1 illustrates a method according to the present invention for forming on a silica substrate an aromatic imine monolayer that is likely to occur selective chemical transformation by soft X-ray irradiation.

Hereinafter, the present invention will be described below in detail. According to the present invention, after forming an aromatic imine monolayer having substituents at its terminal rings by reacting amine groups in an aminosilyated or aminothiolated monolayer previously formed on the substrate with an aromatic aldehyde compound having various substitutents, the substituents are selectively cleaved from the aromatic imine molecular layer by soft X-rays irradiation (having a wavelength of 0.1-10 nm at an energy of 40-1,500 eV), which is accompanied by chemical changes in the molecular layer, thereby resulting in a high-resolution pattern.

The aromatic aldehyde compound that provides the substituents to be selectively cleaved may be a nitro-substituted or halogen atom-substituted benzaldehyde having formula (1) below or conjugated aromatic aldehyde.

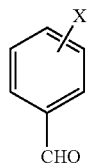

where X is $NO_2$, F, Cl, Br, or I.

Suitable conjugated aromatic aldehydes include any aldehyde compound having one terminal substituted with a nitro group or halogen atom and the other terminal capable of forming an imine bond by condensation with the amine group on the surface of the substrate. However, the compounds having formulae (2), (3), and (4) below capable of binding to amine groups on the substrate surface at a high density and inducing a great pattern height difference are preferred.

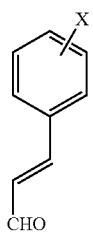

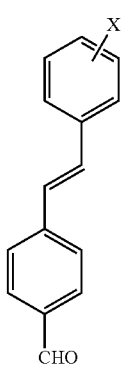

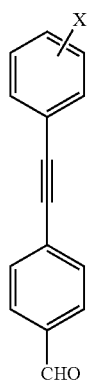

In formulae (2), (3), and (4) above, X is $NO_2$, F, Cl, Br, or I.

As described above, the amine groups in the aminosilyated or aminothiolated monolayer on the surface of a silica substrate or gold substrate are reacted with the aromatic aldehyde compound by heating in ethanolic solution under an inert gas atmosphere, so that the aromatic imine molecular layer is formed on the substrate.

When the aromatic imine monolayer is heated in pure deionized water, imine bonds are hydrolyzed to separate the aromatic aldehyde from the amino silane molecular or amino thiol molecular layer on the substrate. As a result, the hydrophilic amine groups are exposed on the surface of the substrate.

However, once the aromatic imine molecular layer is irradiated with soft X-rays, the substituents on the terminal ring of the aromatic imine monolayer, which may be nitro groups or halogen group atoms, are selectively cleaved, and the imine bonds on the surface of the molecular layer are transformed into non-hydrolyzable chemical species, thereby resulting in a new molecular layer. At this time, a surface region of the substrate from which the substituents have been cleaved shows hydrophobic property.

As described above, when soft X-ray irradiation onto the substituted aromatic imine monolayer through an appropriately designed photomask is followed by hydrolysis in deionized water, an irradiated region of the molecular layer that is not hydrolyzed becomes to have a hydrophobic surface having the aromatic ring, whereas a non-irradiated region of the molecular layer where the imine groups are hydrolyzed becomes to have a hydrophilic surface having the amine group. As a result, a desired high-resolution pattern of alternate hydrophilic and hydrophobic regions can be formed on the surface of the substrate.

Hereinafter, a method for forming a nano-scale high resolution pattern on a substrate according to the present invention will be described with reference to the appended drawings.

Initially, a method for forming an aromatic imine monolayer using aminosilylated substrates will be described. A substrate on which the aromatic imine molecular layer will be formed is washed and dried. The clean substrate was immersed into a solution (20 mL) containing a silane coupling agents under nitrogen atmosphere, and placed in the solution for 6 h. Any amino silane compound producing no acidic byproduct, for example, (3-aminopropyl)diethoxymethylsilane, may be used without limitations. An example of solvent for dissolving the amino silane compound may be toluene. Any kind of substrate, for example, a silica substrate, a gold substrate, etc., may be used in the present invention without limitations. When a gold substrate is used, it is preferable to treat the gold substrate with an alkane thiol compound having an amine group at its terminal.

When the above amino silylation is completed, the substrate is washed with a solvent and dried.

The amino-silylated substrate is immersed and heated in an ethanolic solution of a nitro- or halogen-substituted aromatic aldehyde compound under an inert gas atmosphere. The heating temperature may range from 20° C. to 100° C., and the heating time may range from 1 hour to 20 hours. After the reaction is completed, the substrate is washed with an organic solvent.

Through the above-described processes a substrate with the aromatic imine molecular layer, as shown in FIG. 1, can be obtained.

Figure 2:
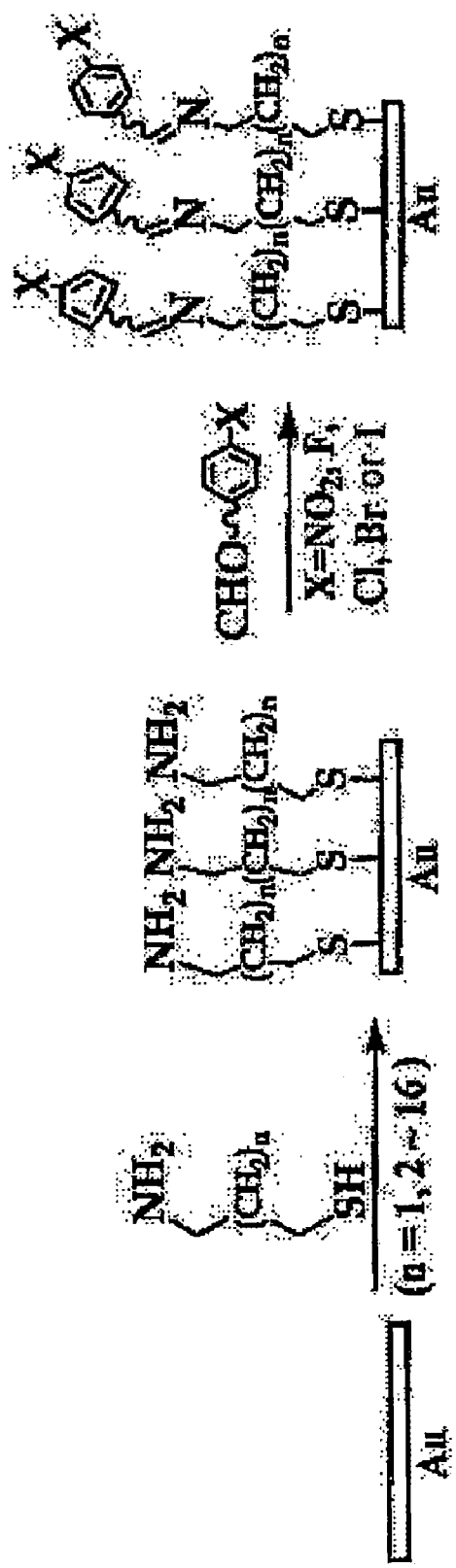
FIG. 2 illustrates a method according to the present invention for forming on a gold substrate an aromatic imine monolayer that is likely to occur selective chemical transformation by soft X-ray irradiation.

Another embodiment of a substrate with an aromatic imine molecular layer according to the present invention is illustrated in FIG. 2. The substrate of FIG. 2 is prepared in a similar manner as in the previous embodiment described with reference to FIG. 1, except that a gold substrate and an amino thiol compound are used instead of the silica substrate and the amino silane compound, respectively. An example of the amino thiol compound used in the present embodiment to form a monomolecular layer may be 3-aminopropanethiol. Ethanol may be used as a solvent for dissolving the amino thiol compound.

A substrate with an aromatic imine molecular layer as shown in FIGS. 1 and 2 is dried in a vacuum and fixed to a metallic sample holder. A photomask having a desired feature size and shape is placed on the substrate with a separation gap of about 1-10 μm. If the separation gap between the photomask and the substrate is greater than 10 μm, it is difficult to form a pattern having a feature size of 200 nm or less due to light diffraction effects. If the separation gap between the photomask and the substrate is less than 1 μm, the surface of the substrate may be unnecessarily contaminated, and the photomask is highly likely to be broken.

The substrate with the aromatic imine molecular layer fixed to the sample holder and covered with the photomask is placed into an ultra-high vacuum chamber. When the ultra high vacuum chamber is evacuated to $10^{-8}$ torr or less, soft X-rays are perpendicularly radiated onto the surface of the substrate. The soft X-rays may have a range of wavelengths from 0.3 nm (equivalent to 1500 eV) to 10 nm (equivalent to 40 eV). The duration of soft X-ray irradiation is determined to be long enough for the nitro group or halogen atom on the outermost molecular surface of the substrate to be cleaved and separated out. The duration of soft X-ray irradiation may be varied according to the structure of the aromatic imine molecular layer bound to the surface of the substrate and the kind of substituents of the molecular layer. If the wavelength of the soft X-rays is shorter than 0.3 nm, the molecular layer is indiscriminately destroyed. If the wavelength of the soft X-rays is longer than 10 nm, undesirably the substituents cannot be selectively cleaved from the aromatic imine molecular layer.

After the substrate with the aromatic imine molecular layer exposed to the soft X-rays is drawn out of the ultra-high vacuum chamber, the substrate is immersed in pure deionized water and hydrolyzed at a temperature of 20-80° C. for, preferably, about 1-10 hours. The substrate after the hydrolysis is washed with an organic solvent and dried in a vacuum.

Figure 3:
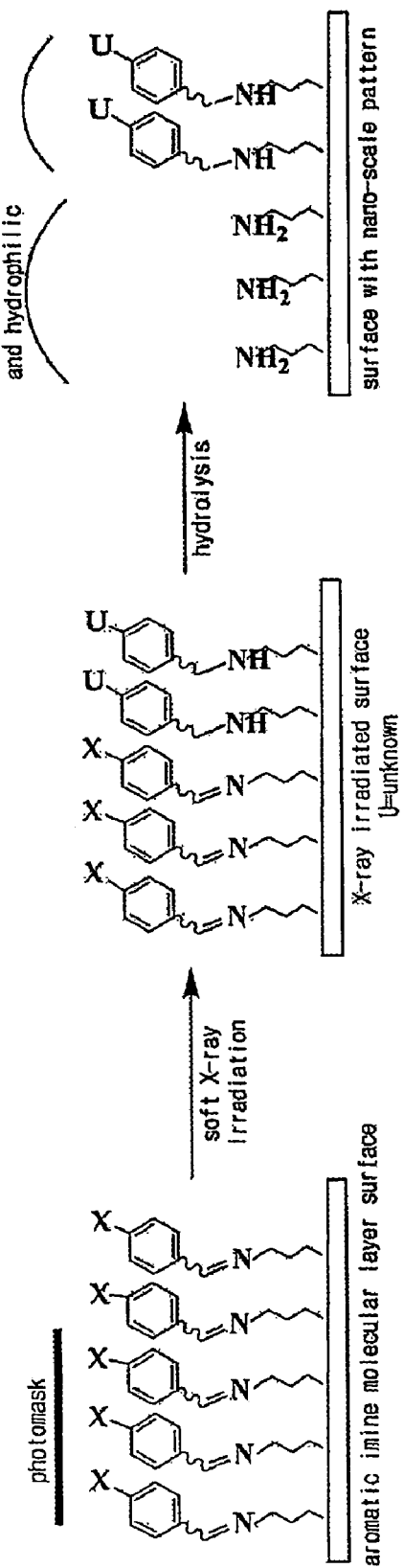
FIG. 3 illustrates a process for high resolution patterning according to the present invention into the aromatic imine monolayer using a photomask.

Through the above-described processes, a pattern of an organic molecular layer can be formed on the substrate, as shown in FIG. 3.

Referring to FIG. 3, in a soft X-ray irradiated region of the organic molecular layer, the nitro group or halogen atom is selectively cleaved, which is accompanied by chemical transformation of the imine bond to be resistant to hydrolysis, thereby resulting in a hydrophobic surface having the aromatic ring. In a non-irradiated region of the organic molecular layer, the imine bond is hydrolyzed so that hydrophilic amine groups are generated on the surface of the substrate. As a result, the irradiated and non-irradiated regions of the organic molecular layer pattern have a height difference equal to the dimension of the aromatic ring and can be visualized using atomic force microscopy (AFM).

A substrate with a nano-scale pattern according to the present invention can be used as a base substrate in manufacturing highly-integrated semiconductor circuits. In particular, when the nano-scale pattern of alternate hydrophobic and hydrophilic regions on the substrate is coated with a diblock copolymer, the height to which the diblock copolymer piles up differs by hundreds of nanometers between the separate hydrophobic and hydrophilic regions. When the substrate is immersed in an appropriate etchant, the high and low regions on the substrate are etched to different degrees, thereby transferring the nano-scale pattern into the substrate.

In particular, a diblock copolymer, for example, poly(styrene-block-polymethylmethacrylate), is coated onto the substrate with the nano-scale pattern formed according to the present invention in a planar structure using, for example, spin coating. On the hydrophilic region of the substrate, polymethylmethacrylate (PMMA) is first arranged, and polystyrene (PS), PS, PMMA, PMMA and PS are sequentially piled thereon, with the upper and outermost layer of PS having a low surface free energy, leading to an asymmetric wetting of the surface. Meanwhile, on the hydrophobic region of the substrate, PS is first arranged, and PMMA, PMMA, and PS are sequentially piled thereon, leading to a symmetric wetting of the surface.

When the substrate with the diblock copolymer thin film is thermally treated at a high temperature, a molecular rearrangement occurs, and the symmetric wetting and asymmetric wetting regions become to have a quantized thickness of $nL_0$ and $(n+1/2)L_0$, respectively, wherein $L_0$ represents the thickness of a repeating unit, i.e., PS-PMMA, in the planar layer structure. In a region where the initial thickness is thinner than a quantized thickness after the thermal treatment, a hole is generated, s. while, in a region where the initial thickness is thicker than a quantized thickness after the thermal treatment, an island is formed. In result, the height contrast of the pattern is amplified.

When the substrate that has been thermally treated is subject to etching, a portion of the organic molecular layer on the surface of the substrate is removed to provide a semiconductor device with a nano-scale pattern. Types of etching which can be used include any common etching applied in the manufacture of semiconductor devices, for example, using a mixture of KCN and KOH solutions or a HF solution as an etchant.

A semiconductor device manufactured with a nano-patterning system according to the present invention as described above can overcome a feature size limit of 130 nm (or 90 nm), which is known to be the highest resolution that can be achieved using currently practical semiconductor manufacturing processes.

Since a nano-scale high resolution pattern according to the present invention has a hydrophilic portion with amine groups that can readily bind to enzymes or other functional substances, it can be applied to biosensors and various material-related fields. In particular, since the hydrophilicity and hydrophobicity of the pattern can be easily controlled on a nano-scale, the advantage of the pattern is the greatest when used for high density protein chips.

In a nano-scale high resolution pattern formed by the method according to the present invention, a region of highly reactive and hydrophilic amine groups serves as a reaction site to which biomolecules, such as proteins, DNA, or RNA can selectively bind. Also, a hydrophobic region of the high resolution pattern, which is alternated with the hydrophilic region, serves as a barrier for different kinds of biomolecules to diffuse without being mixed. Therefore, a nano-scale high resolution pattern formed according to the present invention can be applied to a surface of a substrate in order to form an array of various kinds of biomolecules on the surface through biomolecular interactions. Therefore, the nano-scale high resolution pattern according to the present invention is considered to greatly contribute to the production of high-integrated, high-throughput, miniature biochips.

In general, biochips are manufactured by immobilizing biomolecules on a substrate directly or via linker molecules. For example, a protein chip with antibody molecules can be manufactured by immobilizing the antibody molecules on a solid substrate through chemical interactions with amine groups previously attached to the surface of the solid substrate.

The present invention will be described more fully with reference to the accompanying drawings, in which examples of the invention are shown. This invention may, however, be embodied in many different forms and should not be construed as being limited to the examples set fourth herein; rather these examples are provided so that this disclosure will be thorough and complete, and will fully convey the concept of the invention to those skilled in the art.

EXAMPLE 1

Initially, a cleaned silica substrate was dried in a vacuum of about 20 mtorr. A round-bottom flask was charged with a solution of (3-aminopropyl)diethoxymethylsilane in toluene ($10^{-3}$M) under a nitrogen atmosphere. The dried silica substrate was immersed in that solution and reacted at room temperature for silylation.

After the silylation was completed, the substrate was washed with toluene, dried in an oven at 120° C. for 30 minutes, and cooled to room temperature. The cooled substrate was washed by ultrasonication in toluene, a solvent mixture of toluene and methanol in 1:1 by volume, and then methanol for 3 minutes each, and dried in a vacuum.

Next, the amino-silylated silica substrate was immersed in a solution of 20 mg of 4-nitrobenzaldehyde in 25 mL of ethanol for 6 hours in a nitrogen atmosphere for condensation. At this time, the reaction temperature was maintained at 50° C.

The substrate after the reaction was washed with excess methanol and by ultrasonication in methanol and then ethanol for 1 minute each, and dried in a vacuum.

The resulting 4-nitrobenzealdimine molecular layer on the silica substrate was cut to a size of 1 cm×1 cm, fixed to an aluminum sample holder, covered with a photomask with a separation gap of 5 μm between the molecular layer and the photomask, and placed into a ultra-high vacuum chamber. When the ultra-high vacuum chamber was evacuated to $10^{-8}$ torr or less, soft X-rays of 500 eV were perpendicularly radiated onto the substrate for 6.5 hours. The photomask used was a transmission electron microscopic (TEM) grid of a 1000-mesh size (G-1000HS, Energy Beam Sciences Inc.) The soft X-ray irradiation was performed on a 4B1 photoemission electron microscopy (PEEM) beam line of Pohang Accelerator Laboratory in Korea.

After being drawn out of the ultra-high vacuum chamber, the substrate was immersed in a mixture of 3 mL of pure deionized water and 1 mL of ethanol at 50° C. for 6 hours for hydrolysis. The substrate after the hydrolysis was washed by ultrasonication in a mixture of deionized water and ethanol and then acetone for 3 minutes each, and dried in a vacuum.

Figure 4:
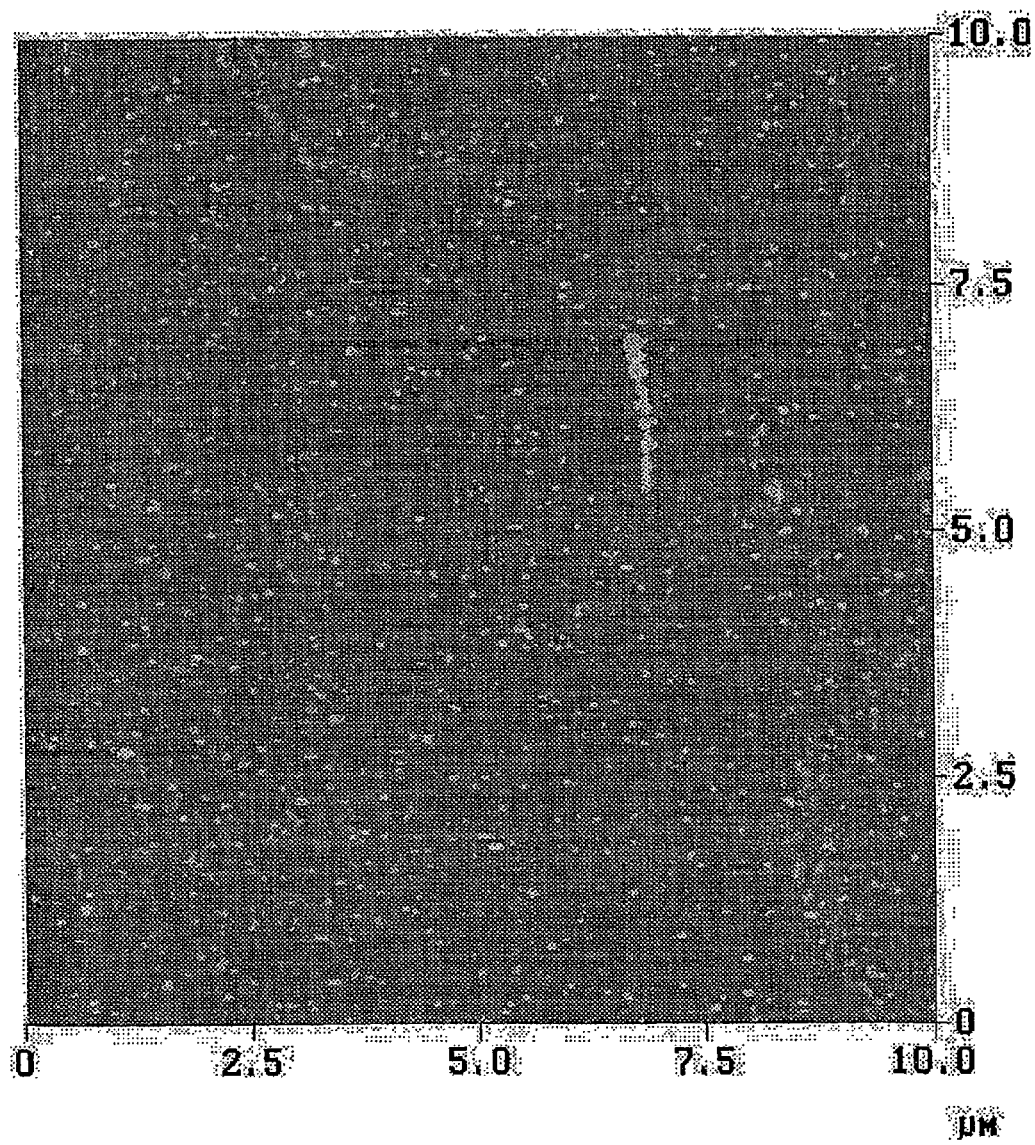
FIG. 4 is a magnified atomic force microscopic photograph of a pattern formed on the surface of a substrate in Example 1 according to the present invention.

The resulting pattern on the substrate was confined using atomic force microscopy. The result is shown in FIG. 4.

EXAMPLE 2

A substrate with a pattern was manufactured in the same manner as in Example 1, except that a gold substrate instead of the silica substrate and 3-aminopropanethiol instead of the (3-aminopropyl) diethoxymethylsilane were used for amino-thiolation. A cleaned gold substrate was immersed in a solution of 3-aminopropanethiol in ethanol (10 mM) and reacted for 3 hours in a nitrogen atmosphere for the amino-thiolation. The substrate after the amino-thiolation was washed with an organic solvent and dried in a vacuum.

EXAMPLE 3

An aromatic imine molecular layer was formed on the substrate in the same manner as in Example 1, except that 4-nitrocinnamaldehyde instead of the 4-nitrobenzaldehyde was used. In patterning, soft X-rays of 500 eV were radiated onto the substrate for 4.5 hours until 80% of the nitro group was removed from the terminal ring in the aromatic imine molecular layer. Hydrolysis was carried out according to Example 1.

EXAMPLE 4

A substrate with a pattern was manufactured in the same manner as in Example 1, except that a zone plate, consisting of engraved gold concentric circles with varying linewidth from hundreds of nanometers to tens of nanometers on silicon nitride membrane, was used as a photomask. In the present example, a zone plate with a minimum feature size of 80 nm in the outer-zone was used as the photomask. When such a zone plate is used as a photomask, the transmittance of soft X-rays through the silicon nitride membrane reduces to about 50%. For this reason, the soft X-rays were radiated for about 24 hours, which is double the duration of X-ray irradiation in Example 1. The soft X-rays were radiated at both 500 eV and 800 eV energy levels.

EXAMPLE 5

A substrate with a pattern was manufactured in the same manner as in Example 1, except that 4-nitrocinnamaldehyde instead of the 4-nitrobenzaldehyde was used, and a zone plate instead of the TEM grid was used as the photomask. The soft X-rays were radiated at both 500 eV and 800 eV energy levels. For the reason described in Example 4, the duration of soft X-ray irradiation was extended to about 10 hours for each energy level.

EXAMPLE 6

A 2% diluted solution by weight of a symmetric poly (stylene-block-methylmethacrylate) copolymer (available from Polymer Source Inc.) in toluene was coated onto the silica substrate with the nano-pattern manufactured in Example 1 using spin coating at 2,500-3,000 rpm. The resulting polymer thin film was thermally treated in a vacuum oven at 180° C. for 24 hours. The substrate after the thermal treatment was immersed in an alkaline solution of 0.01 M KCN and 2M KOH containing $CN^-$ ions and stirred continuously to manufacture a semiconductor device with a nano-scale pattern.

EXAMPLE 7

The silica substrate with the nano-pattern manufactured in Example 1 was reacted with succinimidyl 4-maleimido butyrate (SMB) to immobilize linker molecules thereon. For the immobilization, SMB was initially dissolved in a DMF solvent and diluted ten fold with sodium hydrogen carbonate buffer (50 mM, pH 8.5) to a concentration of 20 mM. 3'-SH-15mer-Cy3-5' was dissolved in a spotting solution (10 mM HEPES, 5 mM EDTA, pH 6.6), followed by an addition of DMSO (40% by volume). The spotting solution mixture was spotted on the substrate on which the linker molecules had been immobilized, using a pin-type spotting instrument for microarrays and left at room temperature and a humidity of 70-75% for 3 hours to manufacture a biochip.

EXPERIMENTAL EXAMPLE 1

Thickness and Surface Density Measurements

Before reaction with the aromatic aldehyde compound in the above examples, the thickness of the aminosilyated or the aminothiolated monolayers and the density of amine groups on the surface of the molecular layer were measured. As a result, the thickness of the molecular layer ranged from 8 Å to 10 Å, and the surface density of amine groups was about 3.5 amines/nm$^2$. After the condensation of the aminosilylated monolayer with 4-nitrobenzaldehyde and 4-nitrocinnamaldehyde, the thickness increased by 4-6 Å and 6-8 Å, respectively.

EXPERIMENTAL EXAMPLE 2

Atomic Fore Microscopic Analysis

The substrate with the pattern manufactured in Example 1 was analyzed using atomic force microscopy (AFM), as shown in FIG. 4. The photograph of FIG. 4 at a scale of 10 μm×10 μm shows a region of the substrate where TEM grid patterns of a 5-μm width intersect. In FIG. 4, outer regions of the intersection appear bright. The bright regions are believed to be higher than the level of the intersection by about 4 Å. In particular, the bright regions were irradiated with light through the TEM grid used as the photomask, so that the nitro group was selectively cleaved and chemical transformation of the imine group occurred in those regions to be resistant to hydrolysis, thereby resulting in a hydrophobic surface having aromatic rings. As a result, the height of the irradiated regions was greater than that of the non-irradiated region where the 5-μm grid patterns intersect to shield light, by a degree equal to the dimension of the aromatic ring.

The gold substrate with the pattern manufactured in Example 2 was also analyzed using AFM. As a result, a similar pattern to that shown in FIG. 4 was observed on the surface of the gold substrate.

Figure 5:
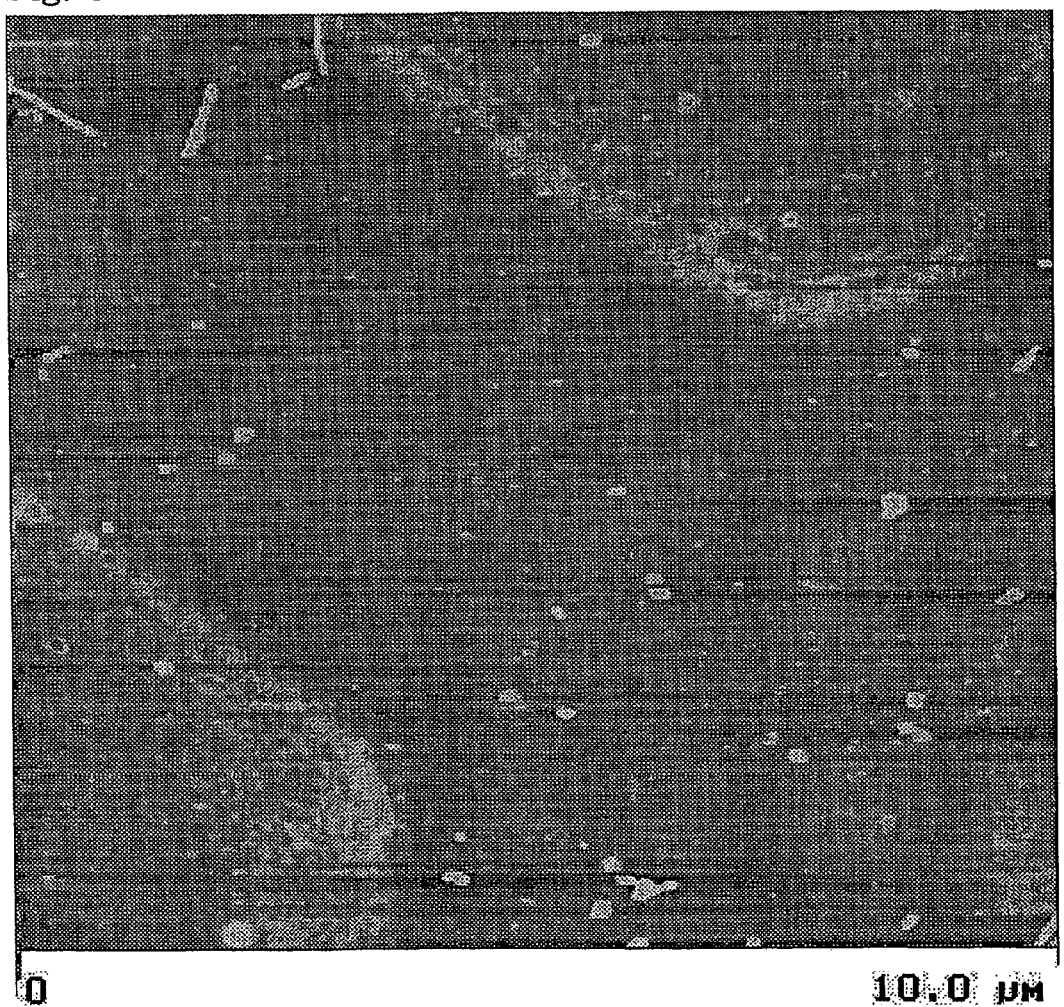
FIG. 5 is a magnified atomic force microscopic photograph of a pattern formed on the surface of a substrate in Example 2 according to the present invention.

FIG. 5 is an AFM photograph of the pattern formed on the substrate in Example 3. Apparently, the soft X-ray irradiated region and non-irradiated regions (corresponding to the intersection of 5-μm grid patterns) have a height difference equal to the dimension of the aromatic ring. Since 4-nitrocinnamaldehyde having an alkene bond (—$CH_2$=$CH_2$—), which is not present in the 4-nitrobenzealdehyde used in Example 1, was used in Example 3, the pattern formed in Example 3 showed a height difference of about 6 Å, which is greater than in Example 1.

Figure 6:
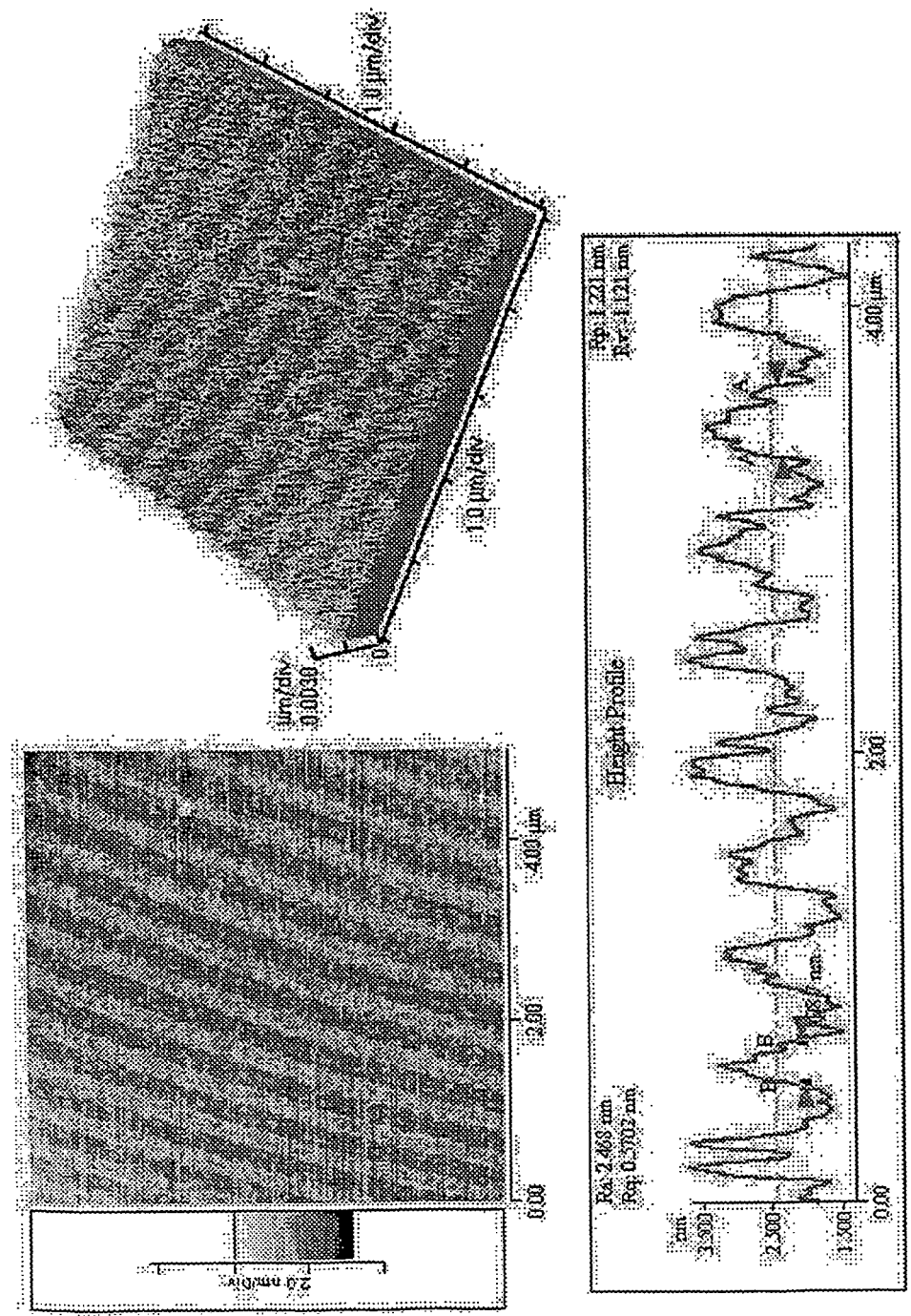
FIG. 6 is an atomic force microscopic photograph of a pattern formed in Example 4 according to the present invention by irradiation with soft X-rays of 500 eV.

FIGS. 6 and 7 are AFM photographs of patterns formed on substrates in Example 4. FIG. 6 shows an edge region of 5 μm×5 μm in the pattern formed by irradiation with soft X-rays of 500 eV through the zone plate. The pattern has a feature size of about 150-300 nm and becomes narrower from right toward left. A line with a feature size of 80 nm was observed at a region further to the left. Bright and dark regions of the pattern shown in FIG. 6 had a height difference of about 7 Å.

Figure 7A:
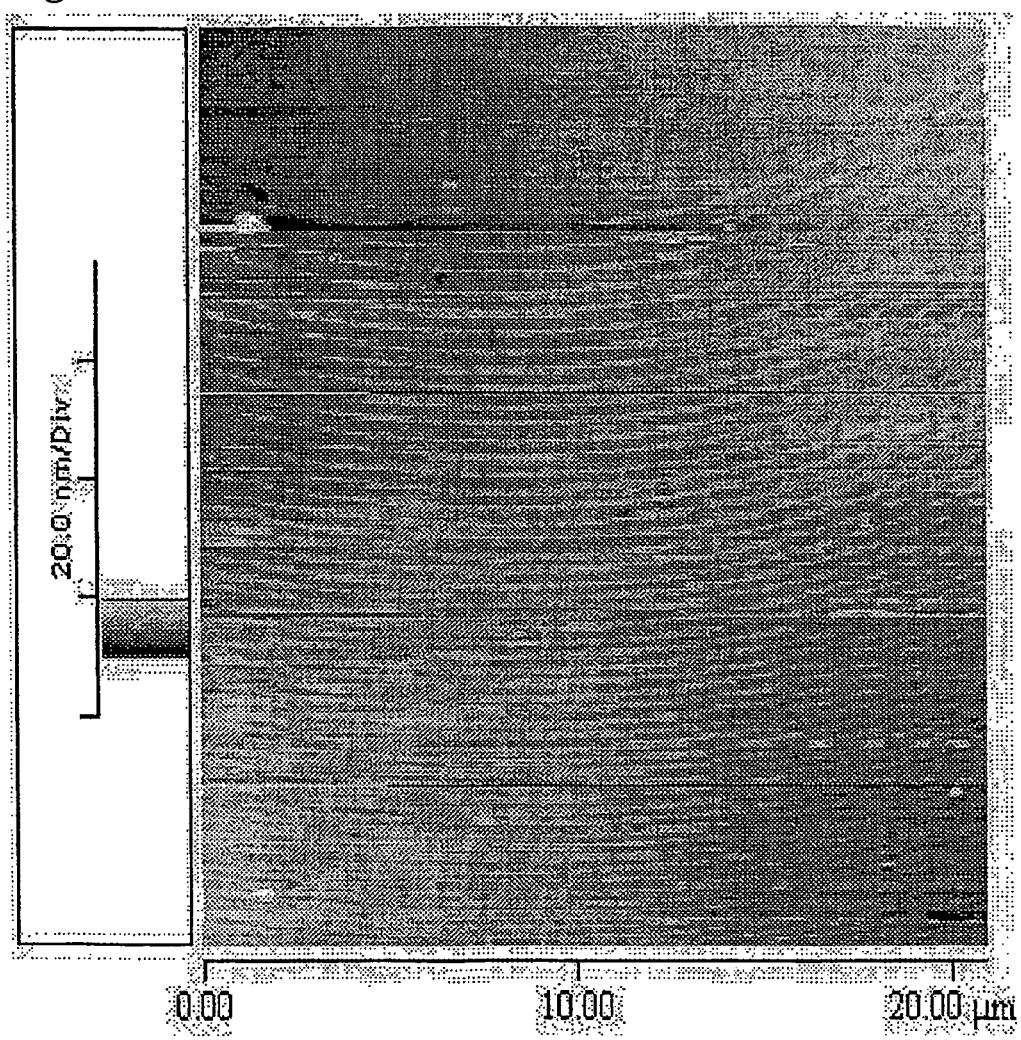
FIG. 7A is a magnified atomic force microscopic photograph at a scale of 22 μm×22 μm of a pattern formed in Example 4 by irradiation with soft X-rays of 800 eV.
Figure 7B:
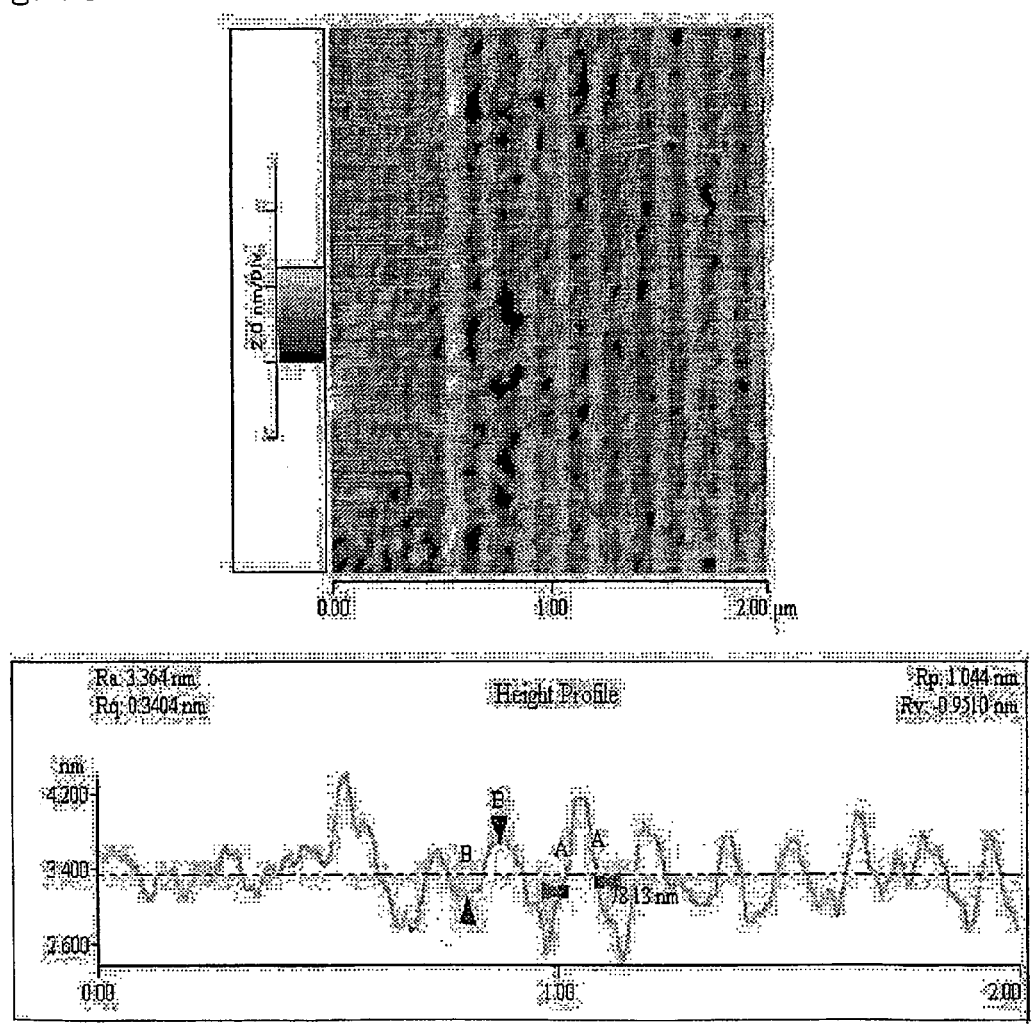
FIG. 7B is a magnified atomic force microscopic photograph at a scale of 2 μm×2 μm of the pattern formed in Example 4 by irradiation with soft X-rays of 800 eV.

FIGS. 7A and 7B are AFM photographs of a pattern formed on a substrate by irradiation with soft X-rays of 800 eV through the zone plate. FIG. 7A shows an inner-zone of the zone-plate imaged surfaces at a scale of 22 μm×22 μm. A partial concentric pattern with a smaller feature size toward a lower part of the photograph is apparent. FIG. 7B shows an outer-zone of the pattern magnified to 2 μm×2 μm. A left portion of the photograph shown in FIG. 2B is a non-pattern region that is unblocked by the zone plate, and a right portion is an outermost pattern region having pattern lines. As expected, a 80-nm pattern line was apparently patterned into the substrate.

The results of the AFM analysis confirms that surface patterning on a scale of a few nanometers can be achieved using the nano-scale patterning method according to the present invention with a higher resolution mask.

According to the present invention, a desired nano-scale high resolution pattern having alternate hydrophilic and hydrophobic regions can be formed on a surface of a substrate within a short period of time. The substrate with such a nano-scale high resolution pattern is greatly useful as a base substrate that is accompanied by coating with a copolymer and selective surface etching in the semiconductor material field. Due to the reactive hydrophilic amine groups in the pattern, binding with enzymes or various functional substances can be controlled on a nano-scale. Therefore, nano-scale high resolution patterning according to the present invention can greatly contribute to the development of highly-integrated biochips or miniaturized biosensors.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for high resolution patterning, comprising:
   (a) forming a self-assembled aminosilyated or aminothiolated monolayer on a substrate and reacting amine groups in said self-assembled aminosilyated or aminothiolated monolayer with aromatic aldehydes having terminal aromatic rings containing substituents, to form an aromatic imine monolayer on said substrate, wherein imine bonds are formed between said self-assembled aminosilyated or aminothiolated monolayer and said aromatic aldehydes;
   (b) removing said substituents of said terminal aromatic rings in selected areas of said aromatic imine monolayer to transform said imine bonds to be non-hydrolyzable in said selected areas; and then
   (c) hydrolyzing said aromatic imine monolayer obtained from step (b) to remove said aromatic aldehydes from areas not selected in step (b), thereby exposing said amine groups in the areas not selected in step (b).

2. The method of claim 1, wherein the aromatic aldehydes are at least one selected from a conjugated aromatic aldehyde or a non-conjugated aromatic aldehyde.

3. The method of claim 2, wherein the non-conjugated aromatic aldehyde is a compound of formula (1) below:

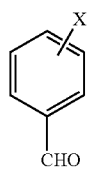

(1)

where X is $NO_2$, F, Cl, Br, or I.

4. The method of claim 2, wherein the conjugated aromatic aldehyde is a compound of formula (2), (3), or (4) below:

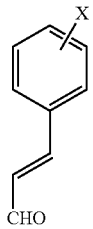

(2)

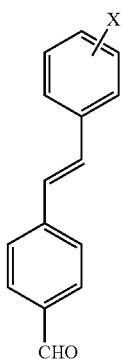

(3)

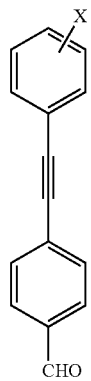

(4)

where X is $NO_2$, F, Cl, Br, or I.

5. The method of claim 1, wherein the substituents contained in the terminal aromatic rings are at least one selected from a nitro group or a halogen group.

6. The method of claim 1, wherein the substrate is formed of silica or gold.

7. The method of claim 1, wherein the substituents are removed in step (b) by exposing the selected areas of the substrate to soft X-rays through a photomask placed on the substrate.

8. The method of claim 7, wherein the soft X-rays have a range of wavelengths from 0.3 nm to 10 nm at an energy of from 40 eV to 1,500 eV.

9. The method of claim 7, wherein the photomask is a zone mask.

* * * * *